(12) United States Patent
Tu et al.

(10) Patent No.: US 9,620,556 B2
(45) Date of Patent: Apr. 11, 2017

(54) METHOD FOR FORMING IMAGE-SENSOR DEVICE

(71) Applicant: TAIWAN SEMICONDUCTOR MANUFACTURING CO., LTD., Hsinchu (TW)

(72) Inventors: Chien-Nan Tu, Kaohsiung (TW); Yu-Lung Yeh, Kaohsiung (TW); Ming-Hsien Wu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/937,372

(22) Filed: Nov. 10, 2015

(65) Prior Publication Data
US 2016/0071899 A1    Mar. 10, 2016

Related U.S. Application Data

(62) Division of application No. 14/161,357, filed on Jan. 22, 2014, now Pat. No. 9,202,837.

(51) Int. Cl.
*H01L 27/14*    (2006.01)
*H01L 27/146*   (2006.01)

(52) U.S. Cl.
CPC .... *H01L 27/14687* (2013.01); *H01L 27/1469* (2013.01); *H01L 27/14601* (2013.01); *H01L 27/14632* (2013.01)

(58) Field of Classification Search
CPC .......... B82Y 30/00; B82Y 10/00; B82Y 5/00; B82Y 20/00; B82Y 99/00; B82Y 40/00; H01L 21/02532; H01L 21/02601; H01L 21/02628; H01L 31/1804; H01L 21/76254; H01L 31/068; H01L 31/182; H01L 27/1266
See application file for complete search history.

(56) References Cited

U.S. PATENT DOCUMENTS

| | | |
|---|---|---|
| 6,245,161 B1 | 6/2001 | Henley et al. |
| 6,375,738 B1 | 4/2002 | Sato |
| 2008/0251126 A1 | 10/2008 | Yamazaki et al. |
| 2009/0111244 A1 | 4/2009 | Yamazaki et al. |
| 2010/0052015 A1 | 3/2010 | Sato |
| 2014/0034816 A1 | 2/2014 | Chuang et al. |
| 2015/0187827 A1 | 7/2015 | Tu et al. |

*Primary Examiner* — Robert Bachner
(74) *Attorney, Agent, or Firm* — Birch, Stewart, Kolasch & Birch, LLP

(57) ABSTRACT

A method for forming an image-sensor device is provided. The method includes providing a first semiconductor substrate having a first surface and a second surface opposite to the first surface. The method includes forming a device layer over the first surface of the first semiconductor substrate. The method includes bonding the first semiconductor substrate to a second semiconductor substrate after the formation of the device layer. The second surface faces the second semiconductor substrate. The method includes forming a diffusion layer between the first semiconductor substrate and the second semiconductor substrate. The diffusion layer has a dopant concentration gradient that increases in a direction from the first semiconductor substrate toward the second semiconductor substrate.

20 Claims, 2 Drawing Sheets

METHOD FOR FORMING IMAGE-SENSOR DEVICE

CROSS REFERENCE TO RELATED APPLICATIONS

This application is a Divisional application of co-pending application Ser. No. 14/161,357, filed on Jan. 22, 2014, the entire content of which is hereby incorporated by reference.

BACKGROUND

The semiconductor integrated circuit (IC) industry has experienced rapid growth. Technological advances in IC materials and designs have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometric size, improvements are being made directly to the IC devices. One such IC device is an image-sensor device. An image-sensor device includes a pixel array (or grid) for detecting light and recording intensity (brightness) of the detected light. The pixel array responds to the light by accumulating a charge. The higher the intensity of the light is, the higher the charge is accumulated in the pixel array. The accumulated charge is then used (for example, by other circuitry) to provide image information for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
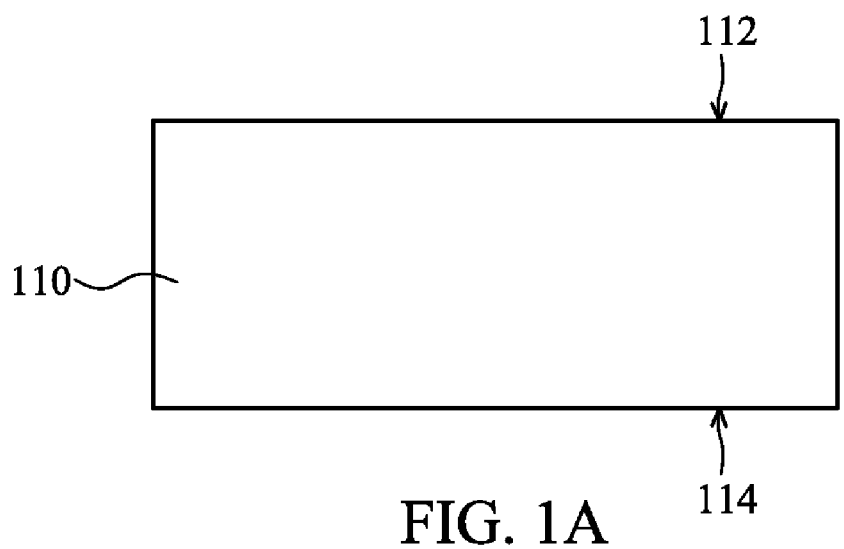
FIGS. 1A-1D are cross-sectional views of various stages of a process for forming an image-sensor device 100, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIGS. 1A-1D are cross-sectional views of various stages of a process for forming an image-sensor device 100, in accordance with some embodiments. As shown in FIG. 1A, a first semiconductor substrate 110 is provided. The first semiconductor substrate 110 has a first surface 112 and a second surface 114 opposite to the first surface 112.

The first semiconductor substrate 110 is a semiconductor wafer (such as a silicon wafer) or a portion of a semiconductor wafer, in accordance with some embodiments. In some embodiments, the first semiconductor substrate 110 is made of an elementary semiconductor material including silicon or germanium in a single crystal, polycrystal, or amorphous structure or other suitable semiconductor materials. In some embodiments, the first semiconductor substrate 110 is a non-doped substrate. In some embodiments, the first semiconductor substrate 110 has a first dopant concentration approximately zero.

In some other embodiments, the first semiconductor substrate 110 is a lightly-doped substrate. The dopants doped in the first semiconductor substrate 110 include III group elements (such as boron), V group elements (such as nitrogen) or other suitable elements. In some embodiments, the first semiconductor substrate 110 has a first dopant concentration less than or equal to about $10^{12}$ cm$^{-3}$.

The first semiconductor substrate 110 has a resistance larger than or equal to about 1000 Ohm-cm, in accordance with some embodiments. The first semiconductor substrate 110 has a resistance larger than or equal to about 10,000 Ohm-cm, in accordance with some embodiments. The first semiconductor substrate 110 has a resistance larger than or equal to about 40,000 Ohm-cm, in accordance with some embodiments.

Figure 1B:
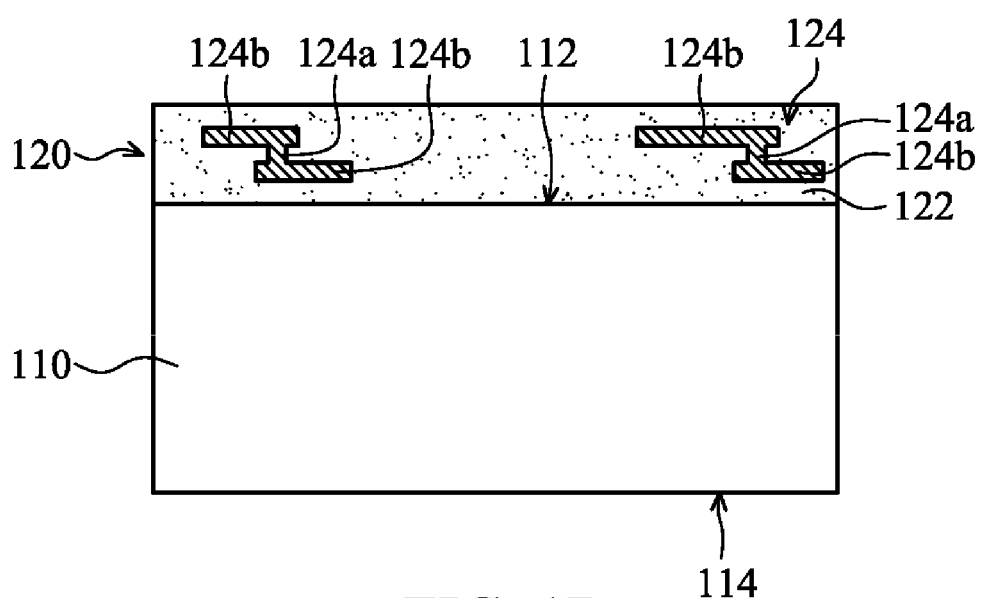

As shown in FIG. 1B, a device layer 120 is formed on (and in) the first semiconductor substrate 110, in accordance with some embodiments. The device layer 120 is on the first surface 112, in accordance with some embodiments. The device layer 120 includes various transistors electrically connected with the first semiconductor substrate 110 to collect (or pick up) electrons generated by incident radiations (incident lights) traveling to the first semiconductor substrate 110 and to convert the electrons into voltage signals, in accordance with some embodiments. For example, the transistors include transfer transistors, reset transistors, source-follower transistors, select transistors, other suitable transistors, or a combination thereof. In some embodiments, the first semiconductor substrate 110 serves as a source region of one of the transistors. The incident radiations (incident lights) include infrared lights or other suitable lights. For the sake of simplicity, detailed structures of the transistors are not shown in figures.

In some embodiments, the device layer 120 further includes an interconnection structure. The interconnection structure includes an interlayer dielectric layer (ILD layer) 122 and a multilayer interconnection (MLI) structure 124 in the interlayer dielectric layer 122, in accordance with some embodiments. The MLI structure 124 includes vias (or contacts) 124a and conductive lines 124b, and each of the vias 124a is electrically connected between the conductive lines 124b. The conductive lines 124b may be electrically connected between the transistors in the device layer 120 to transfer the voltage signals.

Figure 1C:
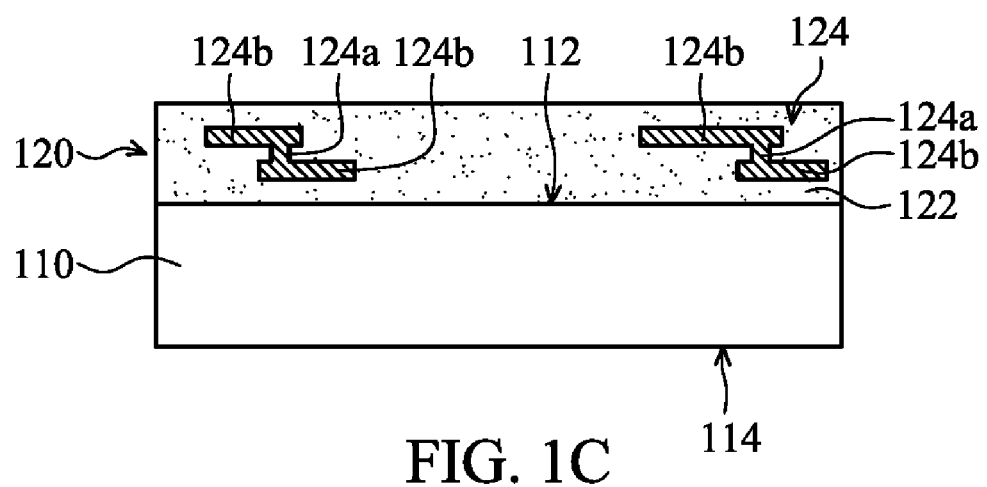

Thereafter, as shown in FIG. 1C, a thinning process is performed to remove a portion of the first semiconductor substrate 110 from the second surface 114, in accordance with some embodiments. The thinning process includes an etching process, a chemical mechanical polishing process and/or other suitable processes.

Figure 1D:
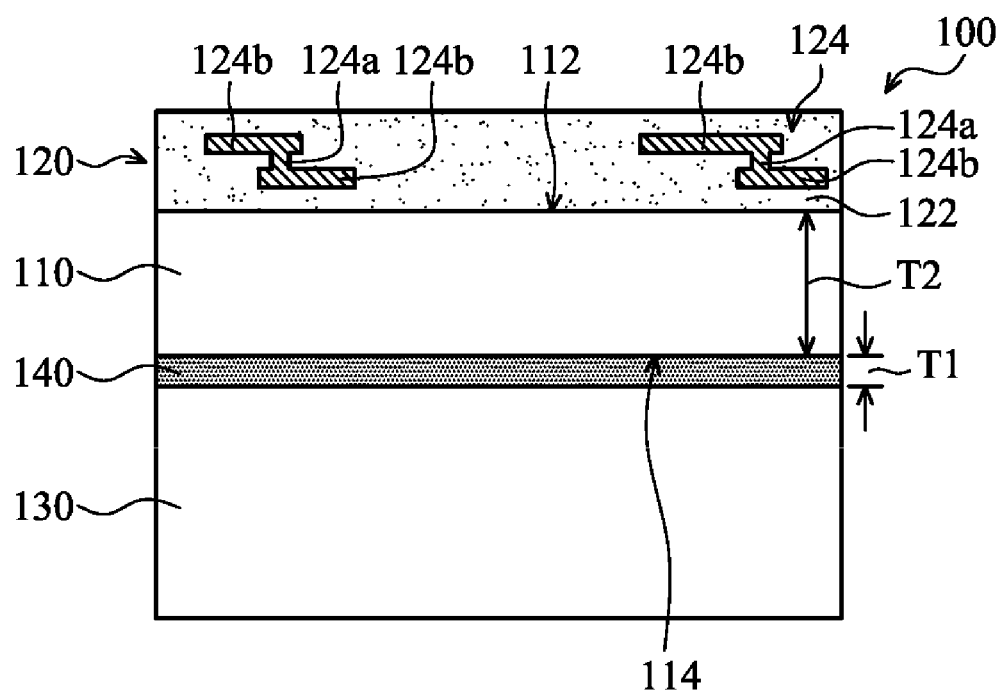

Afterwards, as shown in FIG. 1D, the first semiconductor substrate 110 is bonded to a second semiconductor substrate 130, in accordance with some embodiments. The second surface 114 of the first semiconductor substrate 110 faces the second semiconductor substrate 130, in accordance with some embodiments. In some embodiments, the first semiconductor substrate 110 and the second semiconductor substrate 130 are connected with each other by van der Waals' force.

The second semiconductor substrate 130 is a semiconductor wafer (such as a silicon wafer) or a portion of a semiconductor wafer, in accordance with some embodiments. In some embodiments, the second semiconductor substrate 130 is made of an elementary semiconductor material including silicon or germanium in a single crystal, polycrystal, or amorphous structure or other suitable semiconductor materials.

The second semiconductor substrate 130 is a heavily-doped substrate, in accordance with some embodiments. In some embodiments, the second semiconductor substrate 130 has a second dopant concentration larger than or equal to about $10^{15}$ cm$^{-3}$. In some embodiments, the dopants doped in the second semiconductor substrate 130 include III group elements (such as boron), V group elements (such as nitrogen) or other suitable elements. In some embodiments, the first semiconductor substrate 110 and the second semiconductor substrate 130 are doped with the same elements.

In some embodiments, a ratio of the second dopant concentration of the second semiconductor substrate 130 to the first dopant concentration of the first semiconductor substrate 110 is larger than or equal to about 100. In some embodiments, the ratio of the second dopant concentration of the second semiconductor substrate 130 to the first dopant concentration of the first semiconductor substrate 110 is larger than or equal to about 1000.

In some embodiments, the second semiconductor substrate 130 has a second resistance less than or equal to about 10 Ohm-cm. In some embodiments, the second semiconductor substrate 130 has a second resistance less than or equal to about 1 Ohm-cm. In some embodiments, the second semiconductor substrate 130 has a second resistance less than or equal to about 0.01 Ohm-cm.

In some embodiments, a ratio of the resistance of the first semiconductor substrate 110 to a resistance of the second semiconductor substrate 130 is larger than or equal to about 100. In some embodiments, the ratio of the resistance of the first semiconductor substrate 110 to the resistance of the second semiconductor substrate 130 is larger than or equal to about 1000. In some embodiments, the ratio of the resistance of the first semiconductor substrate 110 to the resistance of the second semiconductor substrate 130 is larger than or equal to about 1,000,000. In some embodiments, the ratio of the resistance of the first semiconductor substrate 110 to the resistance of the second semiconductor substrate 130 is larger than or equal to about 4,000,000.

Thereafter, a baking process is performed to remove the moisture between the first semiconductor substrate 110 and the second semiconductor substrate 130 so as to improve the van der Waals' force, in accordance with some embodiments. In some embodiments, a baking temperature of the baking process is lower than about 400° C. In some embodiments, the baking temperature of the baking process ranges from about 100° C. to about 200° C.

In some embodiments, during the baking process, a diffusion layer 140 is formed between the first semiconductor substrate 110 and the second semiconductor substrate 130. The diffusion layer 140 is in direct contact with the first semiconductor substrate 110 and the second semiconductor substrate 130, in accordance with some embodiments. The diffusion layer 140 has a dopant concentration gradient that increases in a direction from the first semiconductor substrate 110 toward the second semiconductor substrate 130, in accordance with some embodiments. In some embodiments, the dopant concentration gradient increases continuously in the direction. The diffusion layer 140 and the second semiconductor substrate 130 have the same dopants (such as boron), in accordance with some embodiments.

In some embodiments, the diffusion layer 140 has a thickness T1 ranging from about 0.01 μm to about 3 μm. In some embodiments, the diffusion layer 140 has a thickness T1 ranging from about 0.1 μm to about 3 μm. In some embodiments, the thickness T1 ranges from about 0.01 μm to about 2 μm. In some embodiments, the thickness T1 ranges from about 1 μm to about 2 μm.

In some embodiments, the first semiconductor substrate 110 has a thickness T2 ranging from about 0.1 μm to about 8 μm. In some embodiments, the thickness T2 ranges from about 0.5 μm to about 8 μm. In some embodiments, the thickness T2 ranges from about 2 μm to about 4 μm.

In some embodiments, a ratio of the thickness T1 of the diffusion layer 140 to the thickness T2 of the first semiconductor substrate 110 ranges from about 0.1 to about 1. In some embodiments, the ratio of the thickness T1 of the diffusion layer 140 to the thickness T2 of the first semiconductor substrate 110 ranges from about 0.3 to about 0.5. In some embodiments, the ratio of the thickness T1 of the diffusion layer 140 to the thickness T2 of the first semiconductor substrate 110 ranges from about 0.125 to about 0.25. In some embodiments, the ratio of the thickness T1 of the diffusion layer 140 to the thickness T2 of the first semiconductor substrate 110 less than about 0.25.

In some embodiments, the second semiconductor substrate 130 is a p-type substrate (such as a substrate doped with boron). In some embodiments, the difference in the dopant concentration between the first semiconductor substrate 110 and the second semiconductor substrate 130 is large, and a depletion region is formed adjacent to the boundary between the first semiconductor substrate 110 and the second semiconductor substrate 130. Electron-hole pairs may be generated in the depletion region by incident radiations (incident lights) traveling to the depletion region, and the built-in electric field in the depletion region provides a driving force to separate the electrons and the holes of the electron-hole pairs. Therefore, the holes are driven to move to the (p-type) second semiconductor substrate 130, and the electrons are driven to move toward the first surface 112 so as to be collected (picked up) by the transistor(s) in the device layer 120 and to be converted into voltage signals. However, the diffusion layer 140 formed at the boundary during subsequent thermal processes may reduce the driving force of the built-in electric field.

The embodiments of the present disclosure bonds the first semiconductor substrate 110 to the second semiconductor substrate 130 after the formation of the device layer 120. Therefore, the embodiments of the present disclosure prevent the annealing process (with an annealing temperature larger than 700° C.) for forming the devices (such as transistors) of the device layer 120 from forming a thick diffusion layer. Therefore, the diffusion layer 140 of the embodiments of the present disclosure may be formed in a low-temperature baking process, and thus the diffusion layer 140 has a small thickness. As a result, the embodiments of the present disclosure may improve the separation of the electron-hole pairs so as to improve the voltage signals and the sensitivity of the image-sensor device 100.

In accordance with some embodiments, image-sensor devices and methods for forming the same are provided. The methods bond a first semiconductor substrate (a non-doped substrate or a lightly doped substrate) to a second semiconductor substrate (a heavily doped substrate) after the formation of a device layer, so as to prevent the boundary between the first and the second semiconductor substrates from being affected by the formation of the device layer. Therefore, the diffusion layer formed at the boundary is thin, and the voltage signals and the sensitivity of the image-sensor device are improved.

In accordance with some embodiments, a method for forming an image-sensor device is provided. The method includes providing a first semiconductor substrate having a first surface and a second surface opposite to the first surface. The method includes forming a device layer over the first surface of the first semiconductor substrate. The method includes bonding the first semiconductor substrate to a second semiconductor substrate after the formation of the device layer. The second surface faces the second semiconductor substrate. The method includes forming a diffusion layer between the first semiconductor substrate and the second semiconductor substrate. The diffusion layer has a dopant concentration gradient that increases in a direction from the first semiconductor substrate toward the second semiconductor substrate.

In accordance with some embodiments, a method for forming an image-sensor device is provided. The method includes providing a first semiconductor substrate having a first surface and a second surface opposite to the first surface. The method includes forming a device layer over the first surface of the first semiconductor substrate. The method includes bonding the first semiconductor substrate to a second semiconductor substrate after the formation of the device layer. The second surface faces the second semiconductor substrate, and the first semiconductor substrate has a first dopant concentration less than a second dopant concentration of the second semiconductor substrate. The method includes forming a diffusion layer between the first semiconductor substrate and the second semiconductor substrate. The diffusion layer has a dopant concentration gradient that increases in a direction from the first semiconductor substrate toward the second semiconductor substrate.

In accordance with some embodiments, a method for forming an image-sensor device is provided. The method includes providing a first semiconductor substrate having a first surface and a second surface opposite to the first surface. The method includes forming a device layer over the first surface of the first semiconductor substrate. The method includes bonding the first semiconductor substrate to a second semiconductor substrate after the formation of the device layer. The second surface faces the second semiconductor substrate, and a first resistance of the first semiconductor substrate is greater than a second resistance of the second semiconductor substrate. The method includes forming a diffusion layer between the first semiconductor substrate and the second semiconductor substrate. The diffusion layer has a dopant concentration gradient that increases in a direction from the first semiconductor substrate toward the second semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image-sensor device, comprising:
   providing a first semiconductor substrate having a first surface and a second surface opposite to the first surface;
   forming a device layer over the first surface of the first semiconductor substrate;
   after the formation of the device layer, bonding the first semiconductor substrate to a second semiconductor substrate, wherein the second surface faces the second semiconductor substrate; and
   forming a diffusion layer between the first semiconductor substrate and the second semiconductor substrate, wherein the diffusion layer has a dopant concentration gradient that increases in a direction from the first semiconductor substrate toward the second semiconductor substrate.

2. The method for forming an image-sensor device as claimed in claim 1, wherein the formation of the diffusion layer comprises:
   performing a baking process on the first semiconductor substrate and the second semiconductor substrate.

3. The method for forming an image-sensor device as claimed in claim 1, wherein the dopant concentration gradient increases continuously in the direction.

4. The method for forming an image-sensor device as claimed in claim 1, further comprising:
   before the bonding of the first semiconductor substrate to the second semiconductor substrate, performing a thinning process to remove a portion of the first semiconductor substrate from the second surface.

5. The method for forming an image-sensor device as claimed in claim 4, wherein thinning process comprises an etching process or a chemical mechanical polishing process.

6. The method for forming an image-sensor device as claimed in claim 1, wherein the diffusion layer and the second semiconductor substrate have same dopants.

7. The method for forming an image-sensor device as claimed in claim 6, wherein the dopants comprise III group elements or V group elements.

8. The method for forming an image-sensor device as claimed in claim 7, wherein the dopants comprise boron.

9. A method for forming an image-sensor device, comprising:
providing a first semiconductor substrate having a first surface and a second surface opposite to the first surface;
forming a device layer over the first surface of the first semiconductor substrate;
after the formation of the device layer, bonding the first semiconductor substrate to a second semiconductor substrate, wherein the second surface faces the second semiconductor substrate, and the first semiconductor substrate has a first dopant concentration less than a second dopant concentration of the second semiconductor substrate; and
forming a diffusion layer between the first semiconductor substrate and the second semiconductor substrate, wherein the diffusion layer has a dopant concentration gradient that increases in a direction from the first semiconductor substrate toward the second semiconductor substrate.

10. The method for forming an image-sensor device as claimed in claim 9, wherein the diffusion layer is in direct contact with the first semiconductor substrate and the second semiconductor substrate.

11. The method for forming an image-sensor device as claimed in claim 9, wherein the diffusion layer and the second semiconductor substrate have same dopants.

12. The method for forming an image-sensor device as claimed in claim 9, wherein the formation of the diffusion layer comprises:
performing a baking process on the first semiconductor substrate and the second semiconductor substrate.

13. The method for forming an image-sensor device as claimed in claim 9, wherein the dopant concentration gradient increases continuously in the direction.

14. The method for forming an image-sensor device as claimed in claim 9, further comprising:
before the bonding of the first semiconductor substrate to the second semiconductor substrate, performing a thinning process to remove a portion of the first semiconductor substrate from the second surface.

15. The method for forming an image-sensor device as claimed in claim 14, wherein the thinning process comprises an etching process or a chemical mechanical polishing process.

16. A method for forming an image-sensor device, comprising:
providing a first semiconductor substrate having a first surface and a second surface opposite to the first surface;
forming a device layer over the first surface of the first semiconductor substrate;
after the formation of the device layer, bonding the first semiconductor substrate to a second semiconductor substrate, wherein the second surface faces the second semiconductor substrate, and a first resistance of the first semiconductor substrate is greater than a second resistance of the second semiconductor substrate; and
forming a diffusion layer between the first semiconductor substrate and the second semiconductor substrate, wherein the diffusion layer has a dopant concentration gradient that increases in a direction from the first semiconductor substrate toward the second semiconductor substrate.

17. The method for forming an image-sensor device as claimed in claim 16, wherein the dopant concentration gradient increases continuously in the direction.

18. The method for forming an image-sensor device as claimed in claim 16, wherein the diffusion layer and the second semiconductor substrate have same dopants.

19. The method for forming an image-sensor device as claimed in claim 18, wherein the dopants comprise III group elements or V group elements.

20. The method for forming an image-sensor device as claimed in claim 16, wherein the diffusion layer is in direct contact with the first semiconductor substrate and the second semiconductor substrate.

* * * * *